(12) United States Patent
Fischer

(10) Patent No.: US 7,466,200 B2
(45) Date of Patent: Dec. 16, 2008

(54) COMPOSITE OUTPUT STAGE FOR HARD DISK DRIVE PREAMPLIFIER

(75) Inventor: Jonathan H. Fischer, Longmont, CO (US)

(73) Assignee: Agere Systems Inc., Allentown, PA (US)

( * ) Notice: Subject to any disclaimer, the term of this patent is extended or adjusted under 35 U.S.C. 154(b) by 664 days.

(21) Appl. No.: 11/216,993

(22) Filed: Aug. 31, 2005

(65) Prior Publication Data

US 2006/0072232 A1    Apr. 6, 2006

Related U.S. Application Data

(60) Provisional application No. 60/616,790, filed on Oct. 6, 2004.

(51) Int. Cl.
*H03F 3/45* (2006.01)
*G11B 5/02* (2006.01)

(52) U.S. Cl. .................................. 330/257; 360/67
(58) Field of Classification Search ................ None
See application file for complete search history.

(56) References Cited

U.S. PATENT DOCUMENTS

| | | | |
|---|---|---|---|
| 6,762,896 B2 * | 7/2004 | Yoshizawa et al. | ............ 360/67 |
| 6,965,266 B1 * | 11/2005 | Can | ............ 330/252 |
| 7,126,596 B1 * | 10/2006 | Hogan | ............ 345/211 |
| 7,239,467 B2 * | 7/2007 | Yoshizawa et al. | ............ 360/67 |

FOREIGN PATENT DOCUMENTS

| EP | 0669709 A1 | 8/1995 |
|---|---|---|
| JP | 2001297414 | 10/2001 |

* cited by examiner

*Primary Examiner*—Robert Pascal
*Assistant Examiner*—Krista M Flanagan

(57) ABSTRACT

An apparatus for supplying a load current. The apparatus comprises a first differential amplifier producing a differential output signal and an output buffer comprising a first and a second parallel emitter follower transistors each producing a current responsive to the differential output signal. A second differential amplifier responsive to the differential output signal controls current mirror masters that in turn control current source mirrors. Current supplied by each of the current sources mirrors in cooperation with the current produced by each of the first and second transistors produce the load current.

39 Claims, 4 Drawing Sheets

COMPOSITE OUTPUT STAGE FOR HARD DISK DRIVE PREAMPLIFIER

This application claims the benefit of U.S. Provisional Patent Application No. 60/616,790 filed on Oct. 6, 2004.

FIELD OF THE INVENTION

The present invention relates generally to a hard disk drive data storage system, and more particularly to an output stage of a hard disk drive preamplifier operative with the hard disk drive storage system.

BACKGROUND OF THE INVENTION

Disk drives are a cost effective data storage system for use with a computer or other data processing devices. As shown in FIG. 1, a disk drive 10 comprises a magnetic recording medium, in the form of a disk or platter 12 having a hub 13 and a magnetic read/write transducer 14, commonly referred to as a read/write head. The read/write head 14 is attached to, or formed integrally with, a suspension arm 15 suspended over the disk 12 and affixed to a rotary actuator arm 16. A structural arm 18, fixed to a platform 20 of the disk drive 10, is pivotably connected to the actuator arm 16 at a pivot joint 22. A voice coil motor 24 drives the actuator arm 16 to position the head 14 over a selected position on the disk 12.

As the disk 12 is rotated by a spindle motor (not shown) at an operating speed, the moving air generated by the rotating disk, in conjunction with the physical features of the suspension arm 15, lifts the read/write head 14 away from the platter 12, allowing the head to glide or fly on a cushion of air slightly above a surface of the disk 12. The flying height of the read/write head over the disk surface is typically less than a micron.

An arm electronics module 30 may include circuits that switch the head function between read and write operations and write drivers for supplying write current to the head 14 during write operations. The write current alters magnetic domains within the disk 12 to store data thereon. The arm electronics module 30 may also include a preamplifier electrically connected to the head 14 by flexible conductive leads 32. During read operations the preamplifier amplifies the read signals produced by the head 14 to increase the read signal amplitude prior to recovering the data bits represented by the read signal. In the write mode the preamplifier scales up the relatively low voltage levels representing the data bits to be written to the disk to a voltage range between about +/−6V and +/−10V. The preamplifier also shapes the write signal waveform to optimize the data writing process.

The configuration and components of the electronics module 30 may vary according to the disk drive design, as will be understood by persons familiar with such technology. Although the module 30 may be mounted anywhere in the disk drive 10, a location proximate the head 14 minimizes signal losses and induced noise in the head signals during a read operation. A preferred mounting location for the module 30 comprises a side surface of the structural arm 18 as shown in FIG. 1.

As shown in FIG. 2, the disk 12 comprises a substrate 50 and a thin film 52, disposed thereover. During write operations current through a write head 14A alters magnetic domains of ferromagnetic material in the thin film 52 for storing the data bits as magnetic transitions. During read operations a read head 14B senses the magnetic transitions to determine the data bits stored on the disk 12.

Data storage media of alternative data storage systems comprise a floppy magnetic disk, a magnetic tape and a magneto-optic disk (not shown in the Figures) cooperating with the head 14 to read and write data to the storage media.

The disk drive read head 14B comprises either a magneto-resistive (MR) sensor or an inductive sensor. The former produces a higher magnitude output signal in response to the magnetic transitions, and thus the output signal exhibits a greater signal-to-noise ratio than an output signal produced by the inductive sensor. The MR sensor is thus preferred, especially when a higher areal data storage density in the disk drive 10 is desired.

A DC (direct current) bias voltage of about 0.04V to 0.2V is supplied by the preamplifier to the read head terminals 54A and 54B via the conductive leads 32 for biasing the read head 14B. Magnetic domains in the thin film 52 passing under the read head 14B alter a resistance of the magneto-resistive material, imposing an AC (alternating current) component on the DC bias voltage, wherein the AC component represents the read data bits. The AC component is detected in the preamplifier, but has a relatively small magnitude (e.g., several millivolts) with respect to the DC bias voltage.

The output signal from the read head 14B, representing data bits read from the disk drive 10 and having an amplitude in a range of several millivolts, is input to a signal processing stage 102 followed by an output or converter stage 104. Typically, both the signal processing stage 102 and the output stage 104 are elements of the preamplifier. The signal processing stage amplifies the signal and supplies the read head bias voltage. The output stage 104 scales up the head signal voltage to a peak voltage value in a range of several hundred millivolts, supplying the scaled-up signal to channel circuits of a channel chip 106 through an interconnect 108. The channel chip 106 detects the read data bits from the voltage pulses, while applying error detection and correction processes to the read data bits.

Desktop computers typically derive their operating power from an AC power source such as a power grid, and can therefore supply continuously high current levels up to the current capacity of the computer power supply. Although it is advantageous to limit the current drawn (power dissipated) by a desktop computer to limit heat build-up within the computer, generally the current supplied to the computer components is not constrained by the ability of the power source to supply the demanded current.

In contrast to a desktop computer, minimizing power dissipation is a crucial design objective for mobile and portable computing devices and data processing systems, for stored music players and for other battery-powered devices that include a mass data storage system operative with a preamplifier. Early designs of mobile computing devices mimizied power dissipation by trading power consumption with operating speed. That is, the operating speed was limited to reduce current consumption and thus extend battery life. Given the continuing demand for higher operating speeds and data rates, such a trade-off is less desirable.

FIG. 3 illustrates a conventional prior art converter or output stage 104 for scaling up and buffering a differential input signal to drive the interconnect 108 to the channel chip 106. The output stage 104 comprises a differential amplifier 110 (further comprising bipolar junction transistors Q7 and Q6) and an output buffer 112 (further comprising bipolar junction transistors Q12 and Q9 each connected as an emitter follower).

The bipolar junction transistors Q6 and Q7 form a differential amplifier with a degeneration resistor R20 connected between an emitter E of the bipolar junction transistor Q6 and an emitter E of the bipolar junction transistor Q7. The degeneration resistor linearizes the amplification and stabilizes the gain of the differential amplifier 110. Collector load resistors R17 and R19 of Q7 and Q6, respectively, are connected to a supply voltage VCC. Current sources 115 and 116 supply current to the respective transistors Q7 and Q6

The emitter followers Q12 and Q9 of the output buffer 112 operate with a fixed bias (6 mA each in one embodiment) supplied by respective current sources 117 and 118. The emitter followers Q12 and Q9 operate as approximately unity gain class-A amplifiers, i.e., current flows in the output circuit of each transistor Q12 and Q9 at all times. The bipolar junction transistors Q9 and Q12 buffer the collector load resistors R17 and R19 of Q7 and Q6, respectively, to drive the interconnect 108 from a low impedance source, thereby maintaining a wide operating bandwidth, typically up to about 700 MHz.

As is known in the art, in one embodiment the current sources 115, 116, 117 and 118 comprise scaled current mirrors implemented as matched area-ratioed bipolar junction transistors and scaled emitter resistors. For exemplary current sources, see the commonly owned patent application entitled, Current Mirrors Having Fast Turn-on Time, filed on May 27, 2005, and assigned application Ser. No. 11/140,269.

The combination of the high data rate and a length of the interconnect 108 between the output stage 104 and the channel chip 106 (typically about two inches) requires consideration of transmission line effects on the interconnect 108. To reduce reflections between the converter stage 104 (conventionally disposed within the preamplifier) and the separate channel chip 106, impedance matching elements Routp 130 and Routn 132 match the preamplifier output impedance to a characteristic impedance of the interconnect 108. In one embodiment, the impedance matching elements Routp 130 and Routn 132 are disposed internal to the preamplifier and thus are elements of the output stage 104, with the output terminals RDP and RDN connected to the interconnect 108.

An impedance matching element (also referred to as a load element) Rterm 134 (having an impedance approximately equal to the characteristic impedance of the interconnect 108) is located at an input side of the channel chip 106 to reduce signal reflections from the channel chip input back through the interconnect 108. In certain applications a characteristic impedance of the interconnect 108 is about 110 ohms and the value of the element Rterm 134 is about 110 ohms.

The output stage 104 operates as follows. The references to more or less current in the operating description are referenced to an idle input condition where VinP−VinN=0. A differential input signal provided on input terminals VinN and VinP from the signal processing stage 102 biases the base of each bipolar junction transistor Q6 and Q7. For a positive input condition VinP−VinN>0 applied to the differential amplifier 110, the bipolar junction transistor Q6 carries more current than in the idle condition (the transistor pulls up or its operating condition moves in a direction of a saturation condition). A voltage at the collector C of Q6 moves toward ground and drives the base B of Q12 toward ground. This condition causes Q12 to carry less current. The input signal supplied to the base B of the bipolar junction transistor Q7 causes it to carry less current than in the idle condition. A voltage at the collector C of Q7 moves toward the supply voltage VCC and drives the base of Q9 toward VCC. Q9 thus carries more current than in the idle condition. Since the current supplied by each of the current sources 117 and 118 is fixed, the decreased current through Q12 and the increased current through Q9 causes the load current ILoad through Rterm 134 to increase. In response to these current conditions, the voltage at the terminal RDP moves in a positive direction and the voltage at the terminal RDN moves in a negative direction with respect to their idle conditions, producing a more positive voltage drop across Rterm 134.

For a negative input condition VinP−VinN<0, the state of the transistors Q6 and Q7 is reversed from the positive input condition. Thus the bipolar junction transistor Q12 carries more current and Q9 carries less current than when in their idle condition. The voltage at the terminal RDP moves in a negative direction (i.e., lower than the RDP voltage for the positive input condition) and the voltage at the terminal RDN moves in a positive direction (greater than the RDN voltage for the positive input condition), producing a voltage drop across Rterm 134 that is less positive or lower than for the positive input condition.

The bias current produced by the current sources 117 and 118 is fixed (i.e., independent of any signal amplitude variations in the output stage 104) and the net current flowing in the bipolar junction transistors Q9 and Q12 is therefore fixed.

From FIG. 3 it can be seen that, $$i_{Q9} = I118 + \text{ILoad}$$

$$i_{Q12} = I117 - \text{ILoad}$$

where $i_{Q9}$ is the current through the bipolar junction transistor Q9, I118 is the current supplied by current source 118, $i_{Q12}$ is the current through the bipolar junction transistor Q12, I117 is the current supplied by current source 117 and ILoad is the current through the load resistor Rterm 134.

To maintain operation of the output stage 104 in a linear flow distortion) region and maintain a desired signal bandwidth, both Q9 and Q12 require a minimum or overhead current of Iovrhd. Therefore it is necessary that $$I117 \geq \text{Iovrhd} + \text{ILoad max} \quad (1)$$

$$I118 \geq \text{Iovrhd} + \text{ILoad max} \quad (2)$$

where ILoad max is the maximum load current generated in response to a maximum peak-to-peak input signal for VinP and VinN. Sizing the constant current sources 117 and 118 to satisfy equations (1) and (2), as disclosed in the prior art, ensures that Q9 and Q12 have sufficient current flow to operate in the linear region over the full differential input signal range, which is 400 mVp-p according to one application of the output stage 104. However, sizing both of the current sources 117 and 118 to always supply the maximum current required for all input conditions results in supplying more current than may be needed.

According to industry conventions, it is desired that a total harmonic distortion (THD) introduced by the output stage 104 be less than about 0.5% for a 400 mVp-p output swing at the output terminals RDN and RDP.

When operating in a disk drive data storage system for desktop computer with unlimited current capacity, the current sources 117 and 118 are designed to supply a constant current of about 6 mA, an amount sufficient to satisfy the maximum input signal conditions and current overhead requirements discussed above and the THD requirement.

For a disk drive data storage system operative with a mobile or portable computing device, typically deriving its power from an on-board battery, it is desired to improve the power efficiency of the output stage 104 to conserve battery life. However, the THD requirements must be satisfied and proper output stage performance maintained.

BRIEF SUMMARY OF THE INVENTION

According to one embodiment, the present invention comprises an apparatus for supplying a load current to a load in response to a differential input signal comprising a first and a second input signal. The apparatus comprises an output buffer for producing a first current at a first load terminal and a second current at a second load terminal, wherein the first and the second currents are functionally related to the first input signal and the second input signal, and wherein the load is connected between the first and the second load terminals, a first current source connected to the first load terminal for supplying a variable third current as a function of the differential input signal and a second current source connected to the second load terminal for supplying a variable fourth current as a function of the differential input signal, wherein the first, second third and fourth currents cooperate to determine the load current.

According to another embodiment, the present invention comprises a method for supplying a load current responsive to a first and a second differential input signal. The method comprises receiving the first and the second differential input signals, producing a first and a second variable current functionally related to the first and the second differential input signals, producing a third and a fourth current functionally related to the first and the second differential input signals and wherein the first variable current and the third current cooperate at a first terminal and the second variable current and the fourth current cooperate at a second terminal to produce the load current between the first and the second terminals.

BRIEF DESCRIPTION OF THE DRAWINGS

The present invention can be more easily understood and the advantages and uses thereof more readily apparent when the following detailed description of the present invention is read in conjunction with the figures wherein.

In accordance with common practice, the various described device features are not drawn to scale, but are drawn to emphasize specific features relevant to the invention. Like reference characters denote like elements throughout the figures and text.

DETAILED DESCRIPTION OF THE INVENTION

Before describing in detail the particular method and apparatus related to an output stage of a preamplifier for a disk drive system, it should be observed that the present invention resides primarily in a novel and non-obvious combination of elements and process steps. So as not to obscure the disclosure with details that will be readily apparent to those skilled in the art, certain conventional elements and steps have been presented with lesser detail, while the drawings and the specification describe in greater detail other elements and steps pertinent to understanding the invention.

The following embodiments are not intended to define limits as to the structure or method of the invention, but only to provide exemplary constructions. The embodiments are permissive rather than mandatory and illustrative rather than exhaustive. Use of the present invention is not limited to an output stage of a preamplifier for a disk drive storage system and can be used in applications other than those described herein.

Unlike the constant current sources 117 and 118 of the prior art that supply a fixed constant current, the emitter follower current sources of the present invention are controlled in response to the instantaneous differential input signal levels at the terminals VinP and VinN. Controlling the current sources permits a reduction in the current supplied to the emitter follower bipolar junction transistors Q12 and Q9 in response to the input differential signals, lowering power consumption while maintaining compliance with the 0.5% THD requirement. The output stage of the present invention provides improved power efficiency compared with the output stage 104 of FIG. 3 and is thus beneficial for use with a portable or mobile computer or data processing device operating from a battery power supply.

Figure 4:
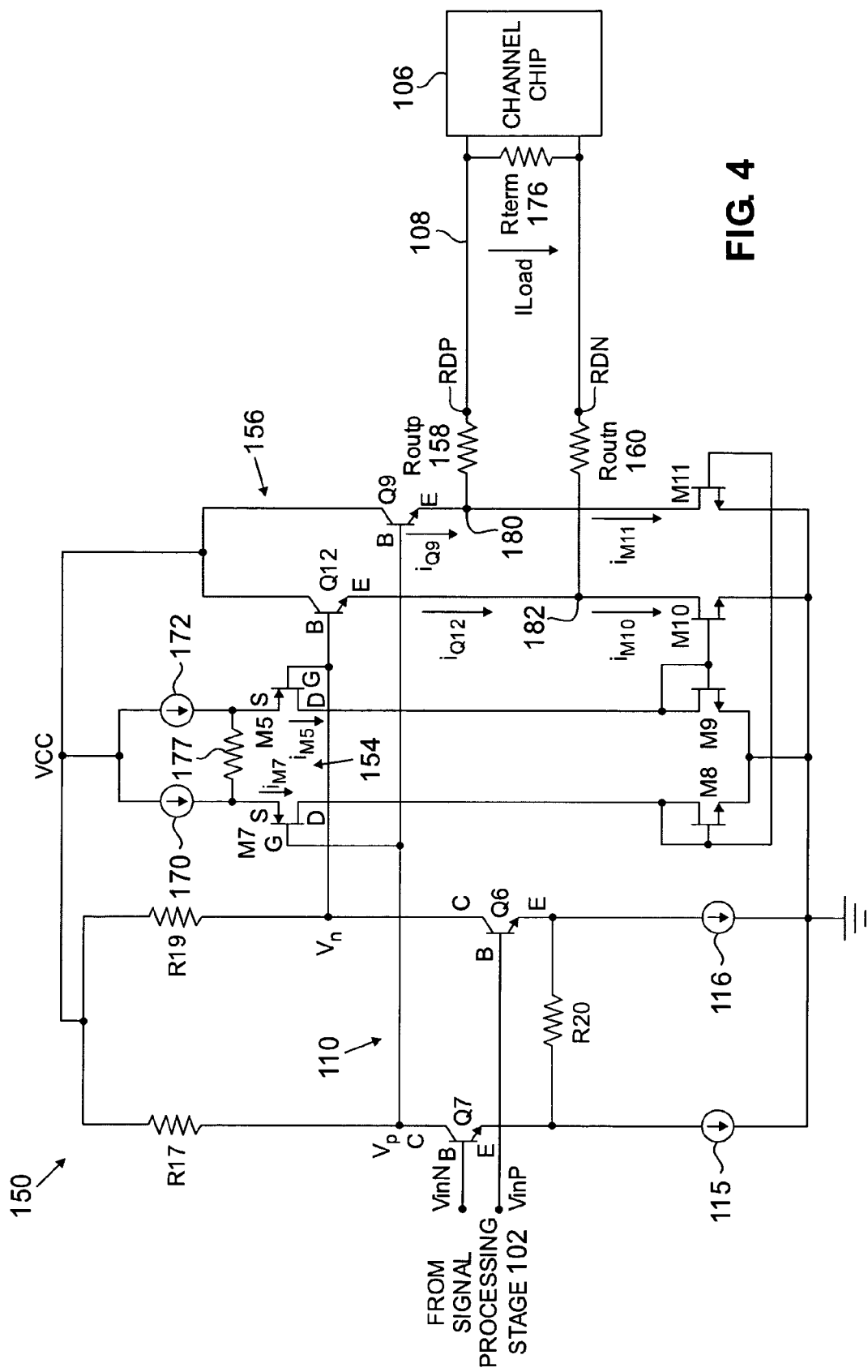
FIG. 4 is a schematic diagram of an output stage of the present invention

An output stage 150 of the present invention illustrated in FIG. 4 includes the differential amplifier 110, an amplifier 154 (a current controlling amplifier for providing control of current sources within the output stage 150) and an output buffer 156. The output stage 150 is illustrated as operative with the power supply rail voltage VCC and ground. Alternatively, the output stage is operative with a high (e.g., positive) and a low (e.g., negative) power supply rail voltage, wherein the low power supply rail voltage includes a negative voltage, a positive voltage less than the high power supply rail voltage and ground.

The amplifier 154 comprises PMOSFETS M5 and M7 and a degeneration resistor 177 connected between sources S thereof, each source S is further responsive to a respective current source 172 and 170. A node $V_n$ (a collector C of the bipolar junction transistor Q6) is connected to a gate G of the PMOSFET M5 and to a base B of the bipolar junction transistor Q12. A node $V_p$ (a collector C of the bipolar junction transistor Q7) is connected to a gate G of the PMOSFET M7 and to a base B of the bipolar junction transistor Q9.

The output buffer 156 comprises the bipolar junction transistors Q12 and Q9 disposed in a parallel configuration relative to the output terminals RDP and RDN. The bipolar junction transistors Q12 and Q9 track the collector voltages ($V_p$ and $V_n$) of bipolar junction transistors Q6 and Q7 respectively, driving the output terminals RDP and RDN. A combination of the amplifier 154 and the output buffer 156 is referred to herein as a composite amplifier.

The PMOSFETS M5 and M7 of the amplifier 154 control current through respective current mirror master NMOSFETS M9 and M8 for controlling respective current source mirror NMOSFETS M10 and M11. Each of the mirror NMOSFETS M10 and M11 supply a controllable current for determining the load current of the converter stage 150.

Impedance matching termination elements Routp 158 (connected between an emitter terminal E of the bipolar junction transistor Q9 and the RDP output terminal) and Routn 160 (connected between an emitter terminal E of the bipolar junction transistor Q12 and the RDN output terminal) match the output stage (of the preamplifier) output impedance to the characteristic impedance of the interconnect 108. The impedance matching element Rterm 176 (having a resistance approximately equal to the characteristic impedance of the interconnect 108) reduces reflections at the channel chip end of the interconnect 108.

A positive differential input signal (VinP−VinN≧0) applied to the VinP and VinN input terminals (connected to the base B of the bipolar junction transistors Q7 and Q6, respectively) causes the bipolar junction transistor Q6 to carry more current and the bipolar junction transistor Q7 to carry less current compared with an idle input condition where VinP−VinN=0. The positive differential input signal causes a voltage at the node $V_n$ to move toward ground and a voltage at the node $V_p$ to move toward the positive supply voltage VCC (in one embodiment VCC is about 3.3 V). These voltage shifts are tracked by the bipolar junction transistors Q12 and Q9, causing the output terminals RDN and RDP to follow the input signal changes as described below.

The upward voltage shift (toward the positive supply voltage) at the node $V_p$ due to the positive differential input signal increases a voltage on a gate G of the PMOSFET M7 toward the supply voltage VCC. The downward voltage shift (toward ground) at the node Vn decreases a voltage of a gate G of the PMOSFET M5 toward ground. Thus in response to the positive differential input signal, a larger share of the current supplied by the current sources 170 and 172 is carried by the PMOSFET M5 and a smaller share is carried by the PMOSFET M7 (compared to the idle condition where VinP=VinN).

The current supplied by the current sources 170 and 172 is divided between the PMOSFETS M7 and M5 in response to their respective gate voltages (where the gate voltages are responsive to the node voltages $V_p$ and $V_n$), the size or area of each of each channel of the PMOSFETS M5 and M7 and a value of the degeneration resistor 177.

With the PMOSFET M5 carrying a larger share of the current ($i_{M5}$) a current through the current mirror master NMOSFET M9 and a current $i_{M10}$ through the current source mirror NMOSFET M10 is greater than the idle current (the current associated with the input condition VinP=VinN). With the PMOSFET M7 carrying a smaller share of the current ($i_{M7}$) a current through the current mirror master NMOSFET M8 and a current $i_{M11}$ through the current source mirror NMOSFET M11 is less than the current associated with the idle input condition.

In addition to controlling the amplifier 154, the upward voltage shift at the node $V_p$ in response to the positive differential input signal increases a voltage on the base B of the transistor Q9 toward the power supply voltage. Transistor action causes a voltage on an emitter E of Q9 to also increase. As a result, the transistor Q9 pulls up and its collector current $i_{Q9}$ increases.

The downward voltage shift at the node Vn responsive to the positive differential input signal decreases a voltage on a base B of the transistor Q12 toward ground potential and a voltage on the emitter E also drops. As a result the transistor's collector current $i_{Q12}$ falls (the transistor is pulling down).

At nodes 180 and 182 the combined effect of the increased current $i_{Q9}$, the decreased current $i_{M11}$, the decreased current $i_{Q12}$ and the increased current $i_{M10}$ increases current ILoad through the load element Rterm 176, increasing the voltage drop across Rterm 176. That is the voltage at RDP increases and the voltage at RDN decreases compared to ground potential or the voltage drop across Rterm 176 increases. Thus the positive differential input signal is reflected to the output terminals RDP and RDN. However, as discussed below, under certain operating conditions and for certain values of the degeneration resistor (Rdegen) 177, $i_{Q9}$ and $i_{Q12}$ do change substantially in response to the input conditions (VinP−VinN>0 and VinP−VinN<0) thus a majority of the load current is supplied by the current sources M11 and M10, that is, currents $i_{M11}$ and $i_{M10}$.

Similarly, for a negative differential input signal VinP−VinN<0, the voltage at the node Vp is driven toward ground and the voltage at the node Vn is driven toward the supply voltage VCC. In response, the amplifier 154 reduces the current $i_{M5}$ through the PMOSFET M5, consequently reducing the current through the NMOSFETS M9 and M10 ($i_{M10}$). The amplifier 154 also increases the current $i_{M7}$ through the PMOSFET M7, thereby increasing the current through the NMOSFETS M8 and M11 ($i_{M11}$) increases.

Further in response to the voltage at the nodes $V_p$ and $V_n$, the voltage at the base B and the emitter E of the transistor Q12 increase and the voltage at the base B and the emitter E of the transistor Q9 decrease. The transistor Q12 pulls up ($i_{Q12}$ increases) and the transistor Q9 pulls down ($i_{Q9}$ decreases).

At the nodes 180 and 182, the combined effect of the decreased current $i_{Q9}$, the increased current $i_{M11}$, the increased current $i_{Q12}$ and the decreased current $i_{M10}$ causes the current ILoad through the load element Rterm 176 to reverse direction compared with the positive differential input signal. The current reversal through the load Rterm 176 reverses the voltage drop across Rterm 176.

Figure 1:
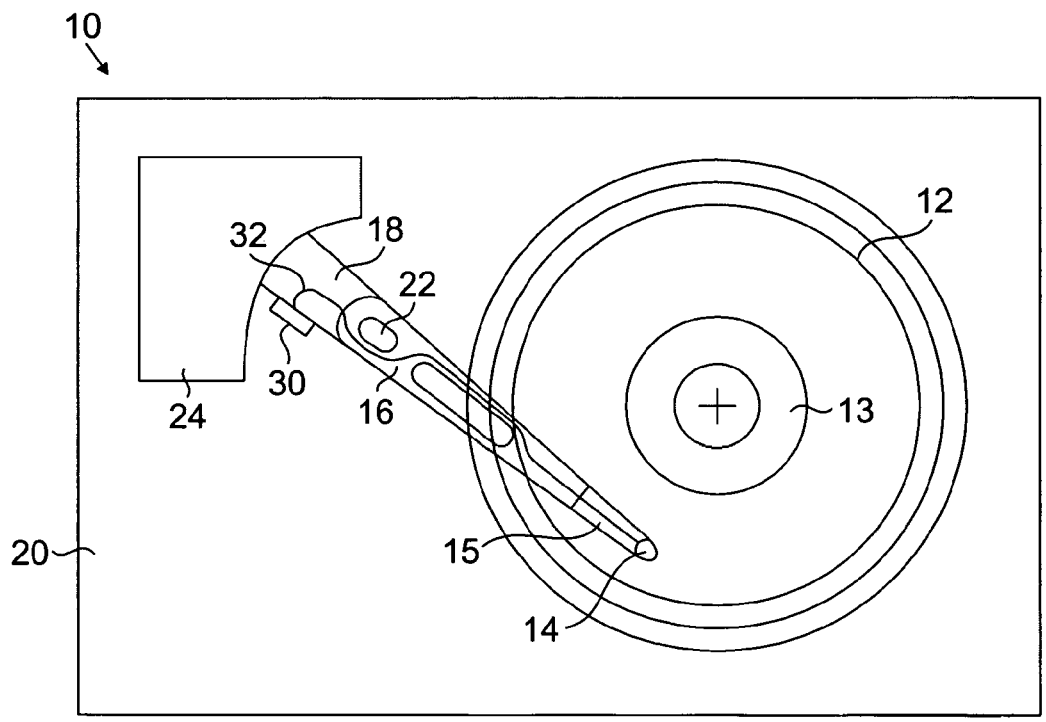
FIG. 1 illustrates a prior art disk drive to which the teachings of the present invention can be applied.
Figure 2:
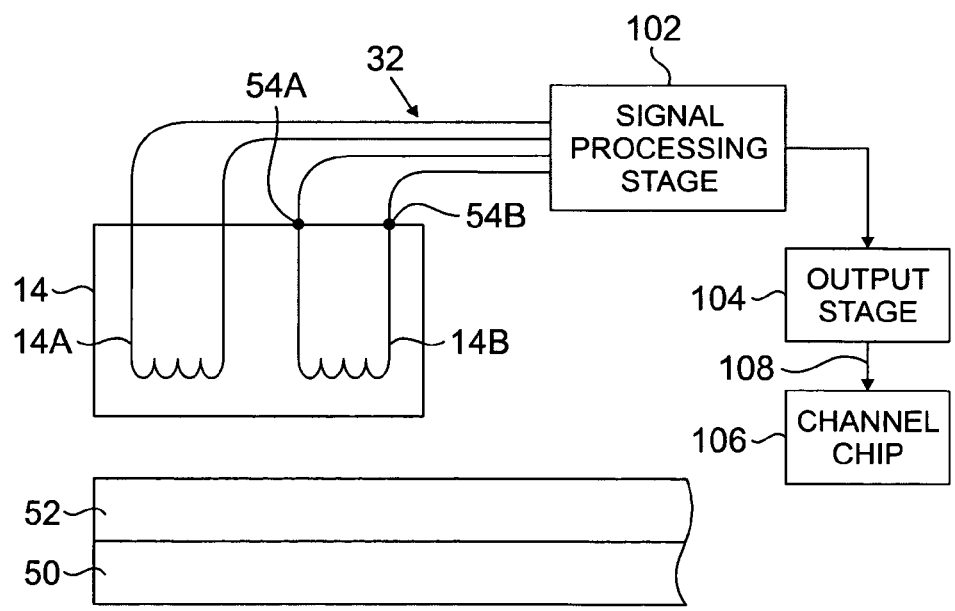
FIG. 2 is a schematic diagram of a prior art head and related components of the disk drive of FIG. 1.
Figure 3:
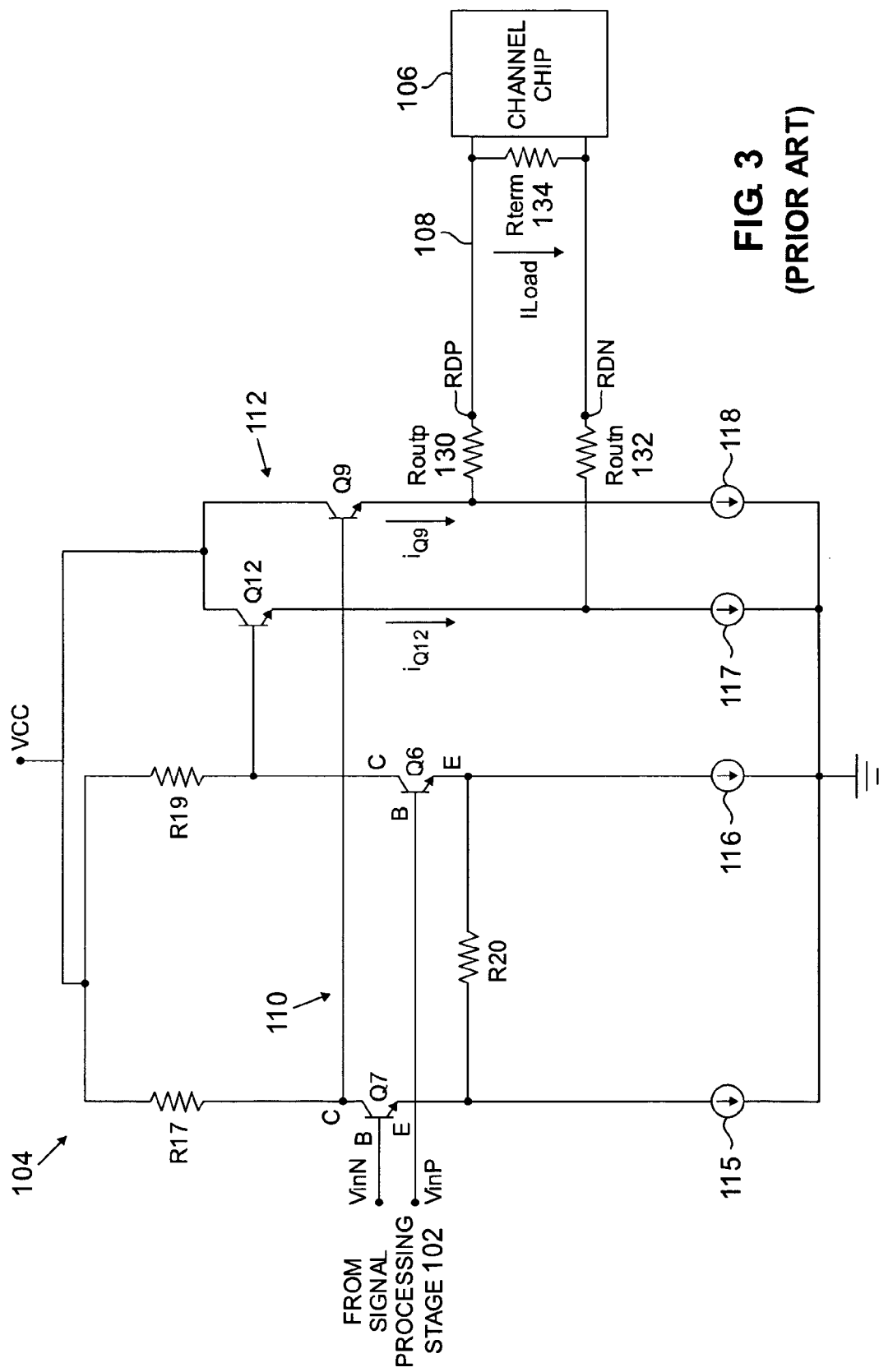
FIG. 3 is a schematic diagram of a prior art output stage for use with the disk drive of FIG. 2.

The output buffer 156 draws less current from the power supply than the prior art output buffer 112 of FIG. 3 because the current through each of the current source mirror NMOSFETS M10 and M11 changes in response to the input signal. That is, when he current $i_{M11}$ increases the current $i_{M10}$ decreases, and vice versa. Whereas the current sources 117 and 118 of the prior art provide a fixed current to supply the current required by a maximum swing of the input signal voltage.

To further illustrate operation of the composite amplifier (i.e., the amplifier 154 and the output buffer 156) in more detail, a small signal analysis of the combined operation of the amplifier 154 and the output buffer 156 is presented below.

The small signal currents through M5 ($i_{M5}$), M7 ($i_{M7}$) and Rdegen 177 are give by:

$$i_{M5} = \frac{V_P - V_N}{1/gm5 + Rdegen + 1/gm7} \quad (3)$$

and $$i_{M7} = -i_{M5}. \quad (4)$$

The current mirror master M9 and the current source mirror M10 mirror and scale $i_{M5}$ by 1/K (i.e., M9=K×M10 W/L) and the current mirror master M8 and current source mirror M11 mirror and scale $i_{M7}$ by 1/K (i.e., M8=K×M11 W/L).

Now analyzing the output stage 156, the current through the bipolar junction transistor Q9 is $$i_{Q9} = i_{M11} + \frac{V_{180} - V_{182}}{Routp + Rterm + Routn} \quad (5)$$

and the current through Q12 is $$i_{Q12} = i_{M10} - \frac{V_{180} - V_{182}}{Routp + Rterm + Routn}, \quad (6)$$

where $V_{180}$ and $V_{182}$ represent the voltage at the nodes 180 and 182, respectively.

Substituting for $M_{10}$ and $i_{M11}$ from equations (3) and (4) into equations (5) and (6) after scaling by 1/K, $$i_{Q9} = -\frac{1}{K}\left(\frac{V_P - V_N}{1/gm5 + Rdegen + 1/gm7}\right) + \frac{V_{180} - V_{182}}{Routp + Rterm + Routn}$$

and $$i_{Q12} = \frac{1}{K}\left(\frac{V_P - V_N}{1/gm5 + Rdegen + 1/gm7}\right) - \frac{V_{180} - V_{182}}{Routp + Rterm + Routn}.$$

The intent of the output stage is to drive the nodes 180 and 182 to closely follow the changes in nodes $V_P$ and $V_N$. Thus the above equations are simplified by replacing $(V_{180}-V_{182})$ with $(V_p-V_n)$ $$i_{Q9} \approx -\frac{1}{K}\left(\frac{V_P - V_N}{1/gm5 + Rdegen + 1/gm7}\right) + \frac{V_P - V_N}{Routp + Rterm + Routn} \quad (7)$$

and $$i_{Q12} \approx \frac{1}{K}\left(\frac{V_P - V_N}{1/gm5 + Rdegen + 1/gm7}\right) - \frac{V_P - V_N}{Routp + Rterm + Routn}. \quad (8)$$

The amplifier 154 provides substantially all the small signal current to the load Rterm 176 (via the current mirror masters M8 and M9 and the current source mirrors M11 and M10) if $i_{Q9}$ and $i_{Q12}$ are zero. This condition is met when from equations (7) and (8), $$K(1/gm5 + R\text{ deg en} + 1/gm7) = Routp + Rterm + Routn \quad (9).$$

With the condition of equation (9) satisfied, the bipolar junction transistors Q9 and Q12 provide the dc bias current to the current source mirrors M10 and M11 and also provide current to correct for any mis-tracking between $V_P-V_N$ and $V_{180}-V_{182}$.

For a specific implementation of the converter stage 150 in a hard disk drive data storage system, the interconnect 108 is designed to exhibit a specific characteristic impedance to match the converter stage output and the channel chip input. The preamp output impedance (i.e., the output impedance of the converter stage 150, which is conventionally the output stage of the preamplifier) and load termination resistor Rterm 176 are set approximately equal to that characteristic impedance value, that is, $$Routp + Routn \approx \text{characteristic impedance of the interconnect } 108 \approx Rterm \quad (10).$$

The scale factor K in the equations above trades signal bandwidth for power conservation of the output stage 150. Using simulations, the inventor has determined that in one embodiment a value of $K \approx \frac{1}{4}$ appropriately balances power consumption and bandwidth, i.e., a conventional 700 MHz bandwidth specification is satisfied.

Thus for $K=\frac{1}{4}$ and knowing the size for each of the PMOSFETS M5 and M7 (the MOSFET size determines the transconductance values gm5 and gm7), a specific value for Rdegen can be determined. For $K=\frac{1}{4}$ and substituting the results from equation (9) into equation (10), reduces equation (10) to $$(1/gm5) + (1/gm7) + Rdegen = 4 \times 2(Rterm) = 8 \times Rterm. \quad (11)$$

The values for gm5 and gm7 can be determined from the fabrication technology employed to implement the amplifier 154. Rterm depends on the characteristic impedance of the interconnect 108 and the signal bandwidth requirements of the target application. In one implementation, Rterm=110 ohms, 1/gm5 and 1/gm7 are each approximately 230 ohms. However, in this implementation the sum (1/gm5)+(1/gm7)+Rdegen was set to approximately 990 ohms (larger than the optimum value of 8×110 ohms=880 ohms) to improve output stage linearity over fabrication process corners. Therefore Rdegen=530 ohms for this implementation.

Increasing Rdegen above this value reduces the portion of the current through the NMOSFETS M10 and M11 that is controlled by the input signal. Reducing Rdegen below this value results in excessive variation of the current supplied by the current source mirror NMOSFETS M10 and M11, which must be compensated by increasing the currents supplied by the bipolar junction transistors Q9 and Q12.

If K is increased to a value closer to one, the bandwidth of the amplifier 154 increases at the expense of requiring more supply current, i.e., increasing power consumption for the output or converter stage 150. Setting K less than ¼ reduces the bandwidth of amplifier 154 significantly due to the gate capacitance of the NMOSFETS M10 and M11 for the fabrication technology employed in one implementation.

To compare power consumption of the output stage of the present invention and the output stage of the prior art, the total supply current for amplifier 154 and the output buffer 156 is $$Itotal_{154+156} = 2(1+K) \times Iidle \quad (12)$$

where Iidle is the current through the NMOSFETS M10 or M11 when VinP−VinN=0. The total supply current for the prior art output buffer 112 of FIG. 3 is $$Itotal_{112} = 2 \times I117 \quad (6)$$

where I117 is the current supplied by the current source 117 in FIG. 3.

Through simulations, the inventor has determined that I117=6 mA to satisfy the 0.5% THD specification when driving Rterm=110 ohms with a 400 mVp-p swing for the differential input signal. The converter stage 150 of the present invention satisfies the THD specification for Rterm=110 ohms and a 400 mVp-p input signal swing when Iidle=3 mA. Thus from equations (5) and (6), the converter stage 150 requires a total supply current of 7.5 mA compared with 12 mA required for the prior art output buffer 112.

Figure 5:
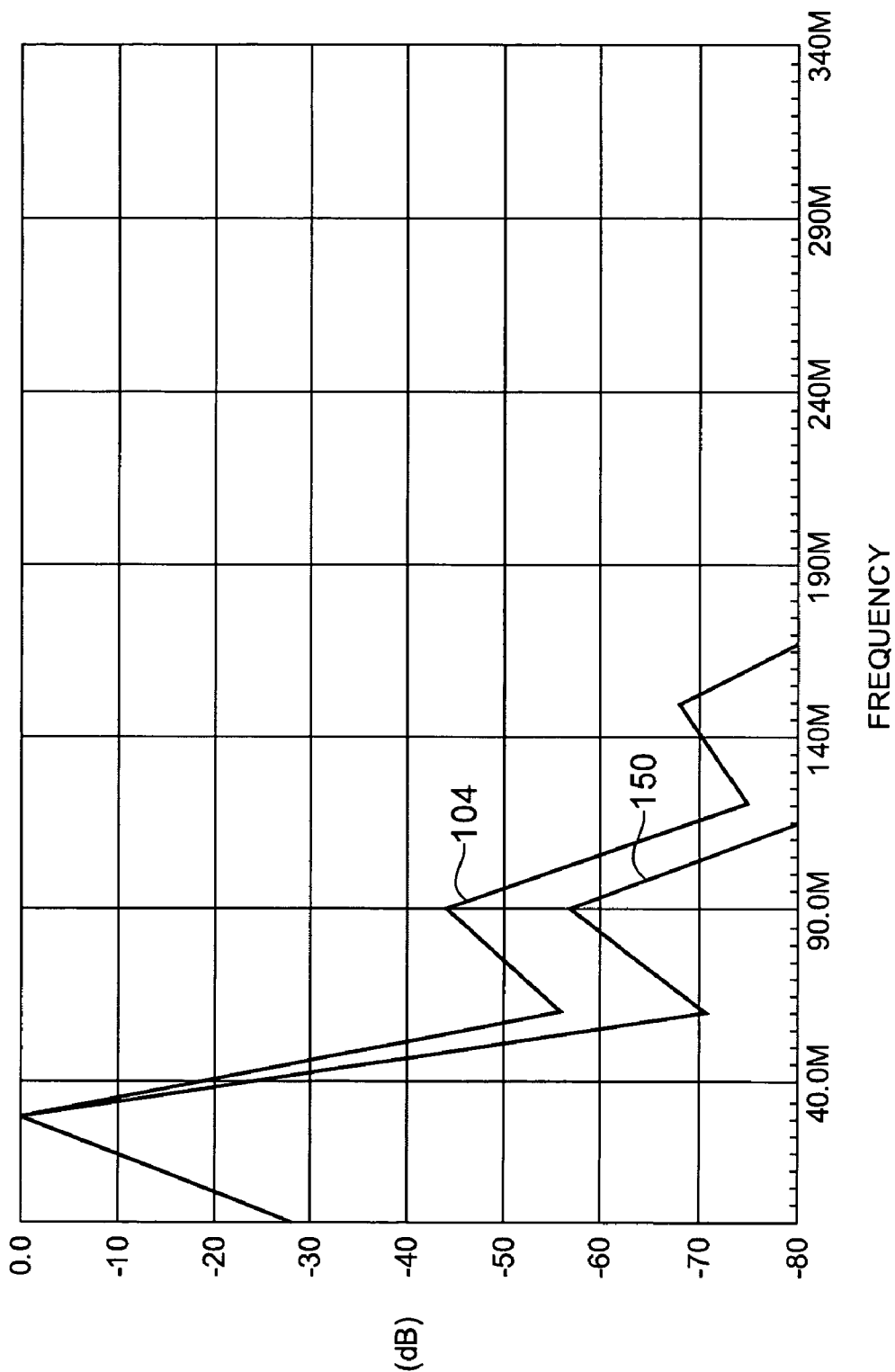
FIG. 5 is a graph illustrating certain performance characteristics of the output converter of FIG. 4 compared with the output converter of FIG. 3.

The output stage 150 of the present invention reduces the emitter current for each of the bipolar junction transistors Q12 and Q9 to about 3 mA each while meeting the 0.5% THD objective. FIG. 5 compares the output spectrum of the prior art output stage 104 of FIG. 3 with the composite amplifier output stage 150 of FIG. 4, when both are biased with 3 mA dc through each of the bipolar junction transistors Q12 and Q9 and for an input signal of 400 mV peak-to-peak at 30 MHz. The output stage 104 does not satisfy the 0.5% THD objective. The output stage 150 satisfies the objective by more than about 10 dB.

In other embodiments, one or more of the MOSFETS and bipolar junction transistors as described herein is replaced by an opposite polarity MOSFET or bipolar junction transistor, and a MOSFET can be replaced by a bipolar junction transistor and vice versa. The associated gate drive signals and power supply voltages are modified to accommodate the doping characteristics of the opposite polarity MOSFET or bipolar junction transistor, while providing the functionality of the present invention. Further, throughout the description of the present invention, the phrase "high" signal value means a "true" or an "asserted" state. Those skilled in the art recognize that other signal values can also be associated with a "true" or an "asserted" logic state with a corresponding change in the device responsive to the logic state.

While the present invention has been described with reference to preferred embodiments, it will be understood by those skilled in the art that various changes may be made and equivalent elements may be substituted for the elements thereof without departing from the scope of the invention. The scope of the present invention further includes any combination of elements from the various embodiments set forth herein. In addition, modifications may be made to adapt a particular situation to the teachings of the present invention without departing from its essential scope. Therefore, it is intended that the invention not be limited to the particular embodiments disclosed, but that the invention will include all embodiments falling within the scope of the appended claims.

What is claimed is:

1. An apparatus for supplying a load current to a load in response to a differential input signal comprising a first and a second input signal, the apparatus comprising:
   an output buffer for producing a first current at a first load terminal and a second current at a second load terminal, wherein the first and the second currents are functionally related to the first input signal and the second input signal, and wherein the load is connected between the first and the second load terminals;
   a first current source connected to the first load terminal for supplying a variable third current as a function of the differential input signal; and
   a second current source connected to the second load terminal for supplying a variable fourth current as a function of the differential input signal, wherein the first, second third and fourth currents cooperate to determine the load current.

2. The apparatus of claim 1 further comprising an amplifier responsive to the differential input signal for controlling the first and the second current sources to produce the variable third and fourth currents 3. The apparatus of claim 2 wherein the amplifier comprises a first current source master controllable according to the first input signal for determining the variable third current and comprises a second current source master controllable according to the second input signal for determining the variable fourth current.

4. The apparatus of claim 3 wherein the amplifier further comprises a first transistor having a first control terminal responsive to the first input signal and a second transistor having a second control terminal responsive to the second input signal, the amplifier further comprising a third current source supplying current to the first and the second transistors, wherein the current through the first and the second transistors is controlled by the first and the second control terminals, and wherein the first and the second current source masters are responsive to the current through the respective first and second transistors for determining the variable third and fourth currents.

5. The apparatus of claim 1 wherein for a condition when the first input signal is greater than the second input signal a magnitude of the third current is greater than a magnitude of the fourth current, and wherein for a condition when the first input signal is less than the second input signal the magnitude of the third current is less than a magnitude of the fourth current.

6. The apparatus of claim 1 further comprising a differential amplifier responsive to the first and the second input signals for producing first and second differential output signals supplied to the output buffer and wherein the first and the second current sources are controllable according to the first and the second differential output signals.

7. The apparatus of claim 1 wherein each one of the first and the second current sources comprises a MOSFET or a JFET.

8. The apparatus of claim 1 wherein the load comprises an impedance matching element for matching an apparatus output impedance to a characteristic impedance of an interconnect element comprising first and second conductors, and wherein the load is connected across the first and the second conductors.

9. The apparatus of claim 8 wherein the apparatus comprises a preamplifier for a disk drive storage system, and wherein the interconnect element connects the first and the second load terminals to a circuit element channel chip.

10. The apparatus of claim 1 wherein the output buffer comprises:
   a first transistor having a first emitter and a first base terminal, wherein the first load terminal comprises the first emitter terminal;
   a second transistor having a second emitter and a second base terminal, wherein the second load terminal comprises the second emitter terminal;
   wherein the first and the second transistors are configured as parallel emitter followers.

11. The apparatus of claim 10 further comprising a differential amplifier responsive to the first and the second input signals for producing first and second differential output signals, wherein the first base terminal is responsive to the first differential output signal and the second base terminal is responsive to the second differential output signal, the apparatus further comprising an amplifier responsive to the first and the second differential output signals for controlling the first and the second current sources to produce the variable third and fourth currents 12. The apparatus of claim 10 wherein each one of the first and the second transistors comprises a bipolar junction transistor.

13. The apparatus of claim 1 wherein a magnitude of the variable third current is greater than a magnitude of the variable fourth current, causing load current to flow through the load in a first direction, in response to a first relationship between the first and the second input signals, and wherein the magnitude of the second current is greater than the magnitude of the first current, causing load current to flow through the load in a second direction, in response to a second relationship between the first and the second input signals.

14. An apparatus for receiving differential input signals and for producing a load current in response thereto, comprising;
   a first differential amplifier producing differential output signals responsive to the differential input signals;
   a current controlling amplifier for controlling first and second current sources responsive to the differential output signals; and
   an output buffer responsive to the differential output signals for producing third and fourth currents, wherein the first and the second current sources supply variable level first and second currents for the output buffer, wherein the load current is a function of the third and the fourth currents and the variable level first and second currents.

15. The apparatus of claim 14 wherein the output buffer comprises first and second transistors configured as parallel emitter followers each having a respective first and second base terminal and each for producing a respective first and second transistor current, the first and the second base terminals responsive to the differential output signals, each of the first and the second transistors further having a respective first and second emitter terminal connected to the respective first and second current sources, wherein the load current is produced at the first and the second emitter terminals responsive to the first and the second transistor currents and to the variable level first and second currents.

16. The apparatus of claim 14 wherein the current controlling amplifier comprises a second differential amplifier producing a current controlling differential output signal for controlling first and second current mirror masters, and wherein the first and the second current mirror masters control the first and the second current sources.

17. An apparatus receiving first and second differential input signals and producing a differential output current, the apparatus comprising;
   a first differential amplifier receiving the first and the second differential input signals and producing first and second differential output signals in response thereto;
   a second differential amplifier comprising a first transistor having a control terminal responsive to the first differential output signal and a second transistor having a control terminal responsive to the second differential output signal;
   a current source supplying current to the second differential amplifier;
   a first current source master responsive to current through the first transistor;
   a second current source master responsive to current through the second transistor;
   a first current source mirror responsive to the first current source master for producing a first current;
   a second current source mirror responsive to the second current source master for producing a second current;
   an output buffer comprising:
      a third transistor having a control terminal responsive to the first differential output signal and producing a third current at a first output terminal; and
      a fourth transistor having a control terminal responsive to the second differential output signal and producing a fourth current at a second output terminal
   and wherein the differential output current is produced at the first and the second output terminals responsive to the first, second, third and fourth currents.

18. The apparatus of claim 17 wherein the first differential amplifier comprises:
   a fifth transistor having a transistor control terminal responsive to the first differential input signal and a transistor output terminal, and wherein the first differential output signal is provided at the transistor output terminal; and
   a sixth transistor having a transistor control terminal responsive to the second differential input signal and a transistor output terminal, and wherein the second differential output signal is provided at the transistor output terminal.

19. The apparatus of claim 18 wherein the fifth transistor comprises a bipolar junction transistor having a first base terminal and a first collector terminal, and wherein the transistor control terminal and the transistor output terminal of the fifth transistor comprise, respectively, the first base terminal and the first collector terminal, and wherein the sixth transistor comprises a bipolar junction transistor having a second base terminal and a second collector terminal, and wherein the transistor control terminal and the transistor output terminal of the sixth transistor comprise, respectively, the second base terminal and the second collector terminal.

20. The apparatus of claim 17 wherein the first transistor and the second transistor comprise, respectively, a first field effect transistor and a second field effect transistor, and wherein the control terminal of the first transistor comprises a gate terminal of the first field effect transistor, and wherein the control terminal of the second transistor comprises a gate terminal of the second field effect transistor.

21. The apparatus of claim 17 wherein the first current source master comprises a first field effect transistor having a channel path in series with a current path through the first transistor, and wherein the second current source master comprises a second field effect transistor having a channel path in series with a current path through the second transistor, the first field effect transistor further comprising a source/drain terminal connected to a gate terminal thereof, and the second field effect transistor further comprising a source/drain terminal connected to a gate terminal thereof.

22. The apparatus of claim 21 wherein the first current source mirror comprises a third field effect transistor having a gate terminal connected to the gate terminal of the first field effect transistor, and wherein the second current source mirror comprises a fourth field effect transistor having a gate terminal connected to the gate terminal of the second field effect transistor, the third field effect transistor having a channel path in series with a current path through the third transistor and the fourth field effect transistor having a channel path in series with a current path through the fourth transistor.

23. The apparatus of claim 17 wherein a magnitude of the first current is greater than a magnitude of the second current, causing the differential output current to flow through a load in a first direction in response to a first relationship between the first and the second differential input signals, and wherein the magnitude of the second current is greater than the magnitude of the first current, causing the differential output current to flow through the load in a second direction in response to a second relationship between the first and the second differential input signals.

24. A converter for receiving first and second differential input signals having a first difference therebetween and for producing first and second differential output signals having a second difference therebetween, wherein the first difference is less than the second difference, the converter comprising;
   a first differential amplifier responsive to the first and the second differential input signals and having first and the second output terminals;
   a second differential amplifier having first and second input terminals responsive to the respective first and second output terminals, the second differential amplifier for producing a first and a second current according to the respective first and second differential input signals;
   an output buffer responsive to the first and the second output terminals for producing third and fourth currents; and
   wherein the differential output signals are produced responsive to the first, the second, the third and the fourth currents.

25. The converter of claim 24 wherein the output buffer further comprises:
   a first transistor having a control terminal connected to the first output terminal for producing the third current; and
   a second transistor having a control terminal connected to the second output terminal for producing the fourth current.

26. The converter of claim 24 wherein a magnitude of the first current is greater than a magnitude of the second current, producing the first differential output signal in response to a first relationship between the first and the second differential input signals, and wherein the magnitude of the second current is greater than the magnitude of the first current, producing the second differential output signal in response to a second relationship between the first and the second differential input signals.

27. An amplifier for processing a time varying differential input, comprising:
   first and second input terminals for receiving the differential input;
   a first transistor configured between a high voltage rail and a low voltage rail, providing a first intermediate output, the first intermediate output being a low voltage in response to the first input terminal receiving a high peak voltage and being a high voltage in response to the input terminal receiving a low peak voltage;
   a second transistor also configured between the high voltage rail and the low voltage rail, providing a second intermediate output, the second intermediate output being a low voltage in response to the second terminal receiving a high peak voltage, and being a high voltage in response to the input terminal receiving a low peak voltage;
   a first amplifier having first and second output terminals for communicating an amplified version of the differential input, a third transistor connected between the high and low voltage rails and configured to provide an output voltage to the first output terminal responsive to the first intermediate output, and a fourth transistor connected between the high and low voltage rails and configured to provide an output voltage to the second output terminal responsive to the second intermediate output; and
   a second amplifier including at least one current source and switching circuitry configured to selectively inject a variable current level into the first amplifier to drive either of the output terminals toward the potential of one voltage rail while the other of the output terminals is driven toward the potential of the other voltage rail.

28. A preamplifier for a disk drive data storage system for supplying a load current to a load in response to a differential input signal comprising a first and a second input signal, the apparatus comprising:
   an output buffer for producing a first current at a first load terminal and a second current at a second load terminal, wherein the first and the second currents are functionally related to the first input signal and the second input signal, and wherein the load is connected between the first and the second load terminals;
   a first current source connected to the first load terminal for supplying a variable third current as a function of the differential input signal; and
   a second current source connected to the second load terminal for supplying a variable fourth current as a function of the differential input signal, wherein the first, second third and fourth currents cooperate to determine the load current.

29. The preamplifier of claim 28 wherein the differential input signal represents stored data bits.

30. The preamplifier of claim 28 wherein the load comprises an impedance matching element for matching an output impedance of the preamplifier to a characteristic impedance of an interconnect element.

31. The preamplifier of claim 30 wherein the impedance matching element comprises a resistor.

32. The preamplifier of claim 28 wherein the load current through the load develops a voltage across the load, and wherein the voltage is representative of the difference between the first and the second input signals, and wherein the voltage has a first value responsive to a first relationship between the first and the second input signals and the voltage has a second value in response to a second relationship between the first and the second input signals.

33. The preamplifier of claim 32 wherein the voltage is greater than the difference between the first and the second input signals.

34. The preamplifier of claim 32 wherein the first value of the voltage has a first polarity and the second value of the voltage has a second polarity opposite to the first polarity.

35. A method for supplying a load current responsive to a first and a second differential input signal, comprising:
   receiving the first and the second differential input signals;
   producing a first and a second variable current functionally related to the first and the second differential input signals;
   producing a third and a fourth current functionally related to the first and the second differential input signals; and
   wherein the first variable current and the third current cooperate at a first terminal and the second variable current and the fourth current cooperate at a second terminal to produce the load current between the first and the second terminals.

36. The method of claim 35 wherein the step of producing the first and the second variable currents comprises controlling a first current source and a second current source according to a functional relationship between the first and the second differential input signals.

37. The method of claim 35 wherein the step of producing the first and the second variable currents comprises producing a first and a second intermediate current functionally related to the first and the second differential input signals and supplying the first and the second intermediate currents to a respective first current source mirror to produce the first variable current and second current source mirror to produce the second variable current.

38. The method of claim 35 wherein a magnitude of the first variable current is greater than a magnitude of the second variable current, causing the load current to flow in a first direction, in response to a first relationship between the first and the second differential input signals, and wherein the magnitude of the second variable current is greater than the magnitude of the first variable current, causing the load current to flow in a second direction, in response to a second relationship between the first and the second differential input signals.

39. A method of processing a differential input signal received at first and second input terminals comprising the steps of
   providing a first rail for receiving a first voltage level and a second rail for receiving a second voltage level;
   providing a differential amplifier stage connected to the first and second rails, the amplifier stage including at least a first transistor configured to generate an output signal representative of a signal provided to the first input terminal; and
   injecting a variable current between the first transistor and one of the rails to control characteristics of the output signal, the current varying as a function of the input signal.

* * * * *